United States Patent
Bredel et al.

(10) Patent No.: US 10,559,702 B2
(45) Date of Patent: Feb. 11, 2020

(54) MONOLITHICALLY INTEGRATED THIN-FILM DEVICE WITH A SOLAR CELL, AN INTEGRATED BATTERY, AND A CONTROLLER

(71) Applicant: International Business Machines Corporation, Armonk, NY (US)

(72) Inventors: Johann H. Bredel, Seibersbach (DE); Hans-Juergen Eickelmann, Nieder-Hilbersheim (DE); Ruediger Kellmann, Mainz (DE); Hartmut Kuehl, Gau-Bischofsheim (DE); Markus Schmidt, Seibersbach (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/351,856

(22) Filed: Mar. 13, 2019

(65) Prior Publication Data
US 2019/0214510 A1  Jul. 11, 2019

Related U.S. Application Data

(60) Continuation of application No. 15/889,420, filed on Feb. 6, 2018, now Pat. No. 10,290,748, which is a
(Continued)

(30) Foreign Application Priority Data

Jan. 14, 2014  (GB) .................................. 1400531.8

(51) Int. Cl.
*H01L 27/142*  (2014.01)
*H01L 31/053*  (2014.01)
(Continued)

(52) U.S. Cl.
CPC ...... *H01L 31/02008* (2013.01); *H01L 27/142* (2013.01); *H01L 31/02021* (2013.01);
(Continued)

(58) Field of Classification Search
CPC ... H01L 31/00; H01L 31/02; H01L 31/02021; H01L 31/0352; H01L 31/035281;
(Continued)

(56) References Cited

U.S. PATENT DOCUMENTS

| 4,217,633 A | 8/1980 | Evans |
| 4,740,431 A * | 4/1988 | Little .................. H01M 10/465 |
| | | 136/244 |

(Continued)

FOREIGN PATENT DOCUMENTS

| CN | 102255004 A | 11/2011 |
| JP | 2002353487 A | 6/2002 |

(Continued)

OTHER PUBLICATIONS

Chopra et al., "Thin-film solar cells: an overview. Progress in Photovoltaics: Research and Applications", vol. 12, Issue 2-3, 3 pages, 2004 (http://www.altmetric.com/details.php?domain=onlinelibrary.wiley.com&doi=10.1002/pip.541).

(Continued)

*Primary Examiner* — Christina Chern
(74) *Attorney, Agent, or Firm* — Jared C. Chaney

(57) ABSTRACT

A thin-film monolithically integrated solar module with a solar cell, an integrated energy storage device, and a controller may be provided. It may comprise a thin-film solar cell, having at least one solar diode, on a transparent substrate, a thin-film energy storage device, and an electronic controller comprising at least one thin-film transistor above the thin-film energy storage device. The electronic controller may be electrically connected to the thin-film (Continued)

solar cell and the thin-film energy storage device by vias. The named functional units may build a monolithically integrated device on one substrate.

7 Claims, 7 Drawing Sheets

Related U.S. Application Data division of application No. 14/589,233, filed on Jan. 5, 2015, now Pat. No. 9,941,419.

(51) Int. Cl.
*H01L 31/02* (2006.01)
*H02S 40/38* (2014.01)
*H02S 40/34* (2014.01)

(52) U.S. Cl.
CPC ............ *H01L 31/053* (2014.12); *H02S 40/34* (2014.12); *H02S 40/38* (2014.12); *Y02E 10/50* (2013.01)

(58) Field of Classification Search
CPC . H01L 31/04; H01L 31/0463; H01L 31/0465; H01L 31/053; H02S 40/38; H02S 40/30
See application file for complete search history.

(56) References Cited

U.S. PATENT DOCUMENTS

| | | | |
|---|---|---|---|
| 5,273,608 A | 12/1993 | Nath | |
| 5,637,187 A | 6/1997 | Takasu et al. | |
| 6,300,158 B1 | 10/2001 | Simburger et al. | |
| 6,593,521 B2 | 7/2003 | Kobayashi | |
| 8,264,808 B2 | 9/2012 | Yun | |
| 8,604,330 B1 | 12/2013 | Hennessy et al. | |
| 9,941,419 B2 | 4/2018 | Bredel et al. | |
| 2003/0008437 A1 | 1/2003 | Inoue et al. | |
| 2003/0070706 A1 | 4/2003 | Fujioka | |
| 2004/0261840 A1 | 12/2004 | Schmit et al. | |
| 2007/0000535 A1 | 1/2007 | Mesmer et al. | |
| 2007/0227579 A1 | 10/2007 | Buller et al. | |
| 2007/0283999 A1 | 12/2007 | Yekutiely et al. | |
| 2008/0078444 A1 | 4/2008 | Atanackovic | |
| 2009/0020149 A1 | 1/2009 | Woods et al. | |
| 2009/0288700 A1 | 11/2009 | Lifka et al. | |
| 2009/0308446 A1 | 12/2009 | Lin et al. | |
| 2010/0116325 A1 | 5/2010 | Nikoonahad | |
| 2010/0126573 A1 | 5/2010 | Youtsey et al. | |
| 2010/0170556 A1 | 7/2010 | Frolov et al. | |
| 2010/0206378 A1 | 8/2010 | Erickson, Jr. et al. | |
| 2011/0041890 A1 | 2/2011 | Sheats | |
| 2011/0041899 A1 | 2/2011 | Josell et al. | |
| 2011/0155303 A1 | 6/2011 | Hansen et al. | |
| 2011/0239450 A1 | 10/2011 | Basol et al. | |
| 2012/0043814 A1* | 2/2012 | Deligianni ...... H01L 31/022458 307/43 |
| 2012/0085384 A1 | 4/2012 | Beitel et al. | |
| 2012/0097215 A1 | 4/2012 | Vermeersch et al. | |
| 2012/0204939 A1 | 8/2012 | Lee et al. | |
| 2012/0256181 A1 | 10/2012 | Shieh et al. | |
| 2012/0262948 A1 | 10/2012 | Lee et al. | |
| 2013/0146120 A1 | 6/2013 | Seel et al. | |
| 2013/0192656 A1 | 8/2013 | Hardin et al. | |
| 2013/0210186 A1 | 8/2013 | Hiraike et al. | |
| 2014/0030841 A1 | 1/2014 | Armstrong et al. | |
| 2014/0206500 A1 | 4/2014 | Van Duren et al. | |
| 2015/0244312 A1 | 8/2015 | Nakaya | |
| 2015/0280028 A1 | 10/2015 | Harley et al. | |
| 2018/0166586 A1 | 6/2018 | Bredel et al. | |

FOREIGN PATENT DOCUMENTS

| | | |
|---|---|---|
| WO | 2009107584 A1 | 9/2009 |
| WO | 2010000855 A2 | 1/2010 |
| WO | 2013065557 A1 | 5/2013 |
| WO | 2014021948 A1 | 2/2014 |
| WO | 2014054271 A1 | 4/2014 |

OTHER PUBLICATIONS

Imtiaz et al., "All-In-One Photovoltaic Power System: Features and challenges involved in cell-level power conversion in ac solar cells", IEEE Industry Applications Magazine, 2013, published on Apr. 26, 2013, 12 pages, © 2013IEEE DOI: 10.1109/MIAS.2012.2215658.

Li et al., "Integrating photovoltaic and power converter characteristics for energy extraction study of solar PV systems", Renewable Energy 2011, vol. 36, Issue 12, pp. 3238-3245, © 2011 Elsevier Ltd. DOI:10.1016/j.renene.2011.02.016.

Moyer, "Managing the Energy and Lifetimes of Thin-Film Batteries", Convergence Promotions LLC, Digi-Key Corporation, Nov. 21, 2012, 5 pages http://www.digikey.com/en/articles/techzone/2012/nov/managing-the-energy-and-lifetimes-of-thin-film-batteries.

Tseng et al., "Photovoltaic Power System with an Interleaving Boost Converter for Battery Charger Applications", International Journal of Photoenergy, vol. 2012, Article ID: 936843, 8 pages, 2012 DOI:10.1155/2012/936843.

Unknown, "Thin Film Battery, Solid State Batteries", Cymbet Corporation, Minneapolis Web Design by First Scribe (2004), 4 pages, © 2014 Cymbet, http://www.cymbet.com.

Unknown, "Energy harvesting", Wikipedia: The Free Encyclopedia (2014), 15 pages http://en.wikipedia.org/wiki/Energy_harvesting.

Unknown, "Technology Insight Report: Thin Film Batteries", Patent iNSIGHT Pro: Transform Patents to Intelligence, pp: 1-48, © 2013 Gridlogics http://www.patentinsightpro.com/techreports/0113/Tech%20Report%20-%20Thin%20Film%20Batteries.pdf.

Unknown, "Thin film rechargeable lithium battery", Wikipedia: The Free Encyclopedia (2014), 7 pages http://en.wikipedia.org/wiki/Thin_film_rechargeable_lithium_battery.

International Search Report dated Jul. 23, 2014 for International Application No. GB1400531.8, 3 pages.

GB Application 1400531.8, entitled "Monolithically integrated thin-film device with a solar cell, an integrated battery and a controller", filed on Jan. 14, 2014.

Eickelmann et al., "An Integrated Micro-Inverter and Thin Film Solar Module and Manufacturing Process", filed on Aug. 14, 2013, DE Application 13/966516.

Eickelmann et al., "Integrated Micro-Inverter and Thin Film Solar Module and Manufacturing Process", filed on Jan. 17, 2014, DE Application 14/157962.

International Searching Authority, International Application No. PCT/EP2014/06333, International filing date Jun. 25, 2014, 12 pages.

Definition of "set" retrieved from http://www.dictionary.com/browse/set on Aug. 17, 2017.

List of IBM Patents or Patent Applications Treated as Related, Dated Mar. 7, 2019, 2 pages.

Bullis, "Exotic, Highly Efficient Solar Cells May Soon Get Cheaper", MIT Technology Review, Jun. 9, 2014, 2 pages.

Markowitz et al., "Multijunction photovoltaic cell", Wikipedia, accessed online Apr. 20, 2015, 11 pages, <http://en.wikipedia.org/wiki/Multijunction%20photovoltaic%20cell?oldid=647853596>.

* cited by examiner

MONOLITHICALLY INTEGRATED THIN-FILM DEVICE WITH A SOLAR CELL, AN INTEGRATED BATTERY, AND A CONTROLLER

CROSS REFERENCE TO RELATED APPLICATION

This application claims priority to United Kingdom Patent Application No. GB1400531.8, filed Jan. 14, 2014, which is incorporated herein in its entirety.

BACKGROUND OF THE INVENTION

The invention relates generally to an integrated thin-film device with a solar cell, an integrated battery and an electronic controller. The invention relates further to a method for manufacturing a related monolithically integrated device. Solar cells are photovoltaic devices which convert sunlight into electricity.

Solar cells are either made of crystalline silicon wafers or are based on thin-film silicon technologies. Alternatively, solar cells may be based on amorphous silicon. Other alternatives may be based on CIGS (Copper-Indium-Gallium-(Di-(Selenide)), CdTe (Cadmium-Telluride) or CZTS (Copper-Zinc-Tin-Sulfide). Solar cells are used in a wide range of applications. They may, e.g., be used to deliver power into a public power grid, recharge batteries in remote locations, recharge mobile devices like mobile telephones, or may function as a sole energy source for pocket calculators. One key design parameter for solar cells is the production price in relation to the efficiency of the conversion process from light energy to electrical energy.

One problem of solar cells is their direct dependence on incoming light. In order to charge batteries efficiently using solar cells, additional electronic components may be required. The electronic components or circuits may be used to transform and reshape the output voltage of solar cells or solar cell modules comprising several solar cells. Individual solar cells have non-linear output efficiency due to the relationship between solar radiation, temperature, and total resistance.

To maximize power output of a solar cell module, solar cell arrays may use one or many different maximum power point tracking (MPPT) techniques. Such devices are typically integrated into a power converter system which provides voltage or current conversion, filtering, and regulation for driving various loads in power grids and batteries. In order to keep price points for production low, solar cells may be integrated with these required additional electronic components.

On the other side, there have been approaches to integrate a solar cell with a prefabricated battery. Such an approach has been described in US 2009/0288700 A1. The document relates to an integrated device comprising at least one inorganic photovoltaic cell, a substrate supporting the inorganic photovoltaic cell, a prefabricated battery coupled to the at least one inorganic photovoltaic cell, and an encapsulation for sealing the integrated device.

Additionally, US 2012/0043814 A1 discloses an integrated photovoltaic electronic cell and battery device. The integrated device includes a photovoltaic cell, a battery, and interconnects providing a three-dimensional integration of the photovoltaic cells and the battery into an integrated device for capturing and storing solar energy.

However, there remains a need to produce high quality thin-film solar modules at low prices ensuring a long life of integrated batteries and easy connectivity to a power grid or other power consumers.

SUMMARY

This need may be addressed by a thin-film integrated device with a solar cell, an integrated battery and a controller and method for manufacturing an integrated device with a solar cell, an integrated battery and a controller according to the independent claims.

According to one aspect, a thin-film integrated device with a solar cell, an integrated energy storage device and a controller may be provided. The thin-film solar module may comprise a thin-film solar cell, having at least one solar diode, on a transparent substrate, a thin-film energy storage device above the thin solar cell, and an electronic controller comprising at least one thin-film transistor above the thin-film energy storage device. Thereby, the electronic controller may be electrically connected to the thin-film solar cell and the thin-film energy storage device through vias. The thin-film solar cell, the thin-film energy storage device and components of the electronic controller may build a monolithically integrated device, i.e., all elements may be built on one substrate.

According to a different aspect, a method for manufacturing a thin-film solar module in a superstrate configuration may be provided. The method may comprise building a thin-film solar cell, having at least one solar diode, on a transparent substrate; building a thin-film energy storage device above the thin solar cell; and building an electronic controller comprising at least one thin-film transistor above the thin-film energy storage device.

The method may further comprise providing electrical connections between the electronic controller, the thin-film solar cell and the thin-film energy storage device by vias. Thus, the superstrate configuration may be built in an integrated thin-film manufacturing process building a monolithically integrated device.

It may be noted that no external elements may be required for a fully functional monolithically integrated solar module. The monolithically integrated solar module may have all required components on board or on-chip.

BRIEF DESCRIPTION OF THE DRAWINGS

Preferred embodiments of the invention will now be described, by way of example only, and with reference to the following drawings.

DETAILED DESCRIPTION

Figure 1A:
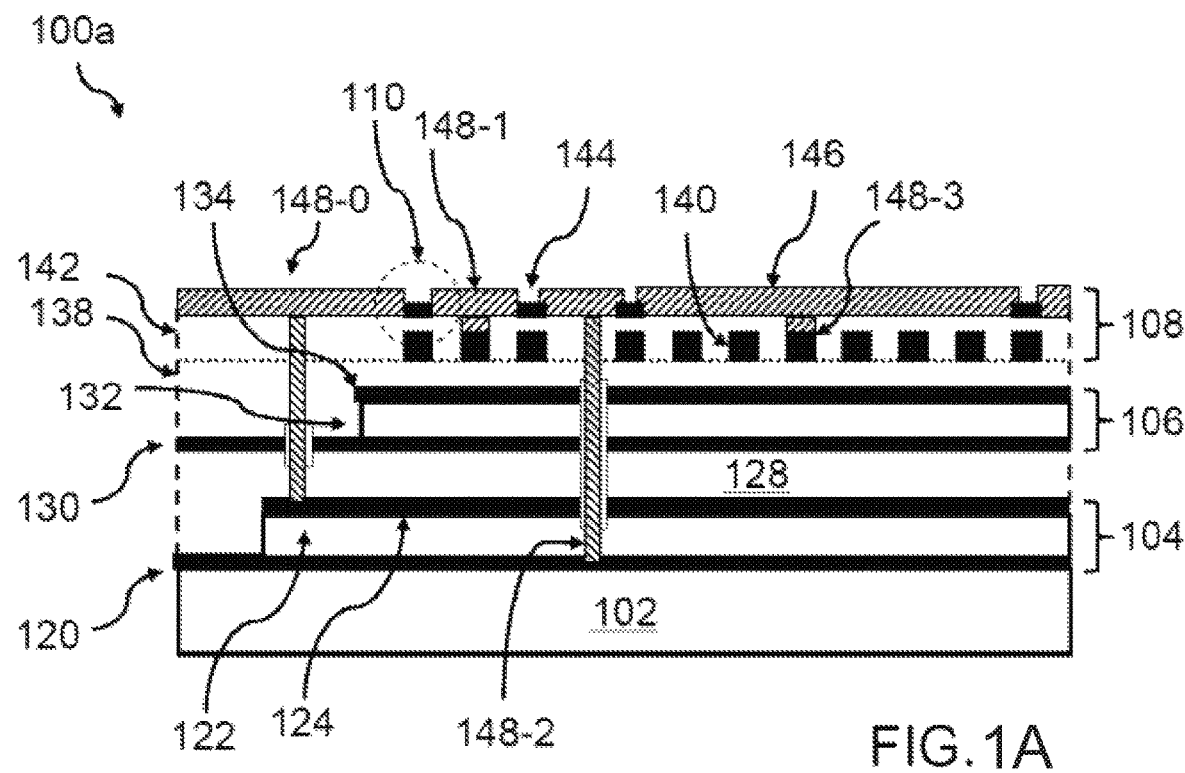
FIG. 1A depicts a thin-film solar module in accordance with an embodiment of the present invention.

In the context of this description, the following conventions, terms and/or expressions may be used:

The term energy storage device may denote a device capable of storing electrical energy. It may either be a battery, e.g., a Lithium based battery, or a super-capacitor. Such a super-capacitor may be charged by a solar cell. Afterwards, it may be discharged, e.g., powering electric or electronic components or delivering its energy to a DC bus.

The term integrated device may denote a device which may integrate several functional units—e.g., a solar cell, an energy storage device as well as active and passive electronic components on one substrate. No prefabricated sub-elements may be required. Every component may be built as part of a three-dimensional stack of functional units.

The proposed thin-film integrated device with a solar cell, an integrated battery, and a controller, and the related manufacturing method, may offer a couple of advantages:

With the integration of a thin-film energy storage device, a thin-film control electronic device and a thin-film solar cell into one solar cell module, the size of the integrated device incorporating all elements can further be reduced if compared to the state of the art. No additional outside wiring between the solar cell, the battery, and/or an electronic circuit may be required. Even if two components—e.g., the solar cell and electronic circuit or, the solar cell and a prefabricated battery—may be integrated, the space requirements and production cost are higher if compared to the integrated proposed solar cell module. Additionally, existing technology does not allow integrating all three functional units into one device which may be manufactured in one integrated thin-film fabrication process. Consequently, prices for providing all three functionalities in one monolithically integrated solar cell module may be reduced. Moreover, the reliability of such device may be increased if compared to individually manufactured components. This may lead to more competitive offerings.

Such integrated thin-film solar modules may also be a basis for completely autonomous sensors. The battery may be charged during daylight time and may deliver enough energy through the battery at night time for keeping a non-wired sensor operational during day and night. Signals to and from the sensor may be transmitted wirelessly. This way, an Industry 4.0 scenario may easily be built. Measurement values of environmental parameters may be collected without any wiring requirements and without any battery exchange requirements. The integrated sensors may be operational continuously, i.e., 24 hours a day, 7 days a week, without any maintenance and/or battery exchange.

Additionally, the integrated electronic circuits may comprise a maximum power point tracking circuitry in order to deliver a maximum output of electrical energy of solar cell arrays. If a series of solar cells may be connected in series, i.e. a solar cell string, in order to achieve a given output voltage, the solar cell in the string having the worst performance may reduce the overall efficiency of the solar cell string. The integrated power conversion electronics as part of the electronic layer of the disclosed thin-film solar module may guarantee a maximum power output of a system of thin-film solar modules.

Lithium based batteries may be used as energy storage devices. However, as known by a skilled person, Lithium batteries may not be exposed to high temperatures during manufacturing, requiring a process sequence to protect the battery from high temperatures. This generally excludes high temperature annealing steps after the deposition of the battery layers. However, as proposed here, an oxide semiconductor may be formed at or near room temperature and hence, may be fabricated after a deposition of the energy storage device. Thus, generally, the temperature required for manufacturing the superstrate configuration of the proposed thin-film solar module decreases from layer to layer.

The integrated controller may have different functions. It may function as a controlling circuit, enabling a connection of the solar module or a series of solar cells to a power grid. The output of the solar cell may also be converted by the electronic controller to ensure the right voltage and/or—in case of AC (alternative current)—the right frequency.

Alternatively, the energy storage device may be connected to the power grid during times the solar cells do not deliver energy. Here, a conversion may be possible using the electronic controller. Many active and passive electronic components may be integrated into the layer of the electronic controller.

As additional function, the electronic controller may control the loading of the energy storage device via the solar cell of the solar module. Overcharging may be avoided and the electronic controller may guarantee the right voltage and current for the loading of the energy storage device. The electronic controller may also control a connection between the solar cell, or the energy storage device, and the DC bus.

The solar module may be enhanced by additional features which may now be discussed:

According to one embodiment of the thin-film solar module, the thin-film solar cell may comprise a transparent front-side electrode atop the transparent substrate, a photovoltaic layer atop the front-side electrode, and a back-side electrode atop the photovoltaic layer. The active parts, i.e., the photovoltaic layer of the solar cell, may comprise an n-type oxide semiconductor, a buffer layer, an absorber material. The back-side electrode may comprise metal like, e.g., Mo, Cu, Al, Ag or other suitable metals, or alloys. The front-side electrode may be built from TCO (transparent conductive oxide).

In one embodiment of the thin-film solar module, a first dielectric layer may be comprised atop the back-side electrode of the solar cell. It may build an isolating layer between the thin-film solar cell and the next functional unit, e.g., the energy storage device.

According to one embodiment of the thin-film solar module, the thin-film energy storage device may comprise a lower electrode, e.g., forming an cathode, atop the first dielectric layer, an active energy storage layer atop the lower electrode, and an upper electrode (134), in particular forming an anode, atop the active energy storage layer. The cathode and the anode may also be built the other way around.

The thin-film energy storage device may comprise several layers of thin-film energy storage devices, one atop the other. These may comprise a hybrid device, i.e. stacked super-capacitors with stacked batteries.

According to one advantageous embodiment of the thin-film solar module, the active energy storage layer may comprise a cathode layer, in particular LiMn-Oxide, a solid electrolyte layer and an anode layer, in particular metallic Lithium or a Li-Carbon-compound. These Li-comprising layers may be directly integrated in-between the solid electrolyte and the upper and lower electrode establishing electrical contact to them.

According to an alternative embodiment of the thin-film solar module, the active energy storage layer may comprise a solid electrolyte between the lower electrode and the upper electrode building a super-capacitor. This may be a more simple approach than a complete battery, as discussed before. The super-capacitor may also be simple to fabricate.

Based on the battery and the super-capacitor there may also be an embodiment of the thin-film solar module combining the two concepts in the active energy storage layer, in particular, the super-capacitor and the battery. This may enhance the flexibility of the thin-film solar module. The super-capacitor may function as an electrical energy buffer of the battery, e.g., in cases of a short term high current demand out of the energy storage device.

In one additional embodiment of the thin-film solar module, a second dielectric layer may be included atop the upper electrode of the energy storage device. This second dielectric layer may function as isolation to a next functional unit. The functional units may be shielded electrically against each other.

According to one enhanced embodiment, the thin-film solar module may comprise a structured first metal layer atop the second dielectric layer, in particular building at least one gate of the at least one transistor. It may be a buried gate of a channel that may be built on top of the so built metal gate. Other components like, e.g., an inductor, may also be built by the structures of the first metal layer.

According to an even more enhanced embodiment of the thin-film solar module, a third dielectric layer may be built atop the structured first metal layer. This third dielectric layer may also fill areas between the structures of the structured first metal layer and thus may also be atop the second dielectric layer. Thus, the structures of the first metal layer may be buried in-between the second and third dielectric layer.

In embodiments of the thin-film solar module, a structured semiconductor layer may be built atop the third dielectric layer overlapping at least in parts with structures of the structured first metal layer. This way, in particular, an active channel of the at least one thin-film transistor may be built over the already discussed gate.

According to one further embodiment of the thin-film solar module, the structured semiconductor layer may comprise a semiconductor oxide compound, in particular amorphous InGaZnO (IGZO) or crystalline IGZO. Amorphous IGZO has high enough electron mobility and may be deposited at nearly room temperature. Thus, its fabrication may not negatively influence lower layers of the thin-film solar device, in particular the cathode and anode regions of the thin-film battery.

According to a further enhanced embodiment of the thin-film solar module, there may be a structured second metal layer side-by-side with the structured semiconductor layer and atop the third dielectric layer connecting components of the electronic controller through vias to the front-side electrode of the thin-film solar cell and to the back-side electrode of the thin-film solar cell. The second metal layer has different purposes: by being attached to the elements of the semiconductor layer, transistors may be formed, and connections between different transistors, vias and other elements may be established.

According to another embodiment of the thin-film solar module, the second metal layer may connect components of the electronic controller through vias to the lower electrode of the thin-film energy storage device and the upper electrode of the thin-film energy storage device. This way either the solar cell or the energy storage device may be attached to the electronic controller.

According to a further embodiment of the thin-film solar module, the structured first metal layer may form an inductor and/or a capacitor. Thus, passive components may be formed within the thin-film device enhancing the capabilities of the electronic controller and lowering the production cost. These passive components may then also be connected to the active elements of the electronic controller.

Turning now to the method for manufacturing the thin-film solar module, the building of the thin-film solar cell may comprise depositing a transparent front-side electrode atop a transparent substrate, depositing a photovoltaic layer atop the front-side electrode, and depositing a back-side electrode (124) onto the photovoltaic layer, so as to form a thin-film solar cell. The photovoltaic layer has already been described above.

According to a further embodiment of the method, the building the thin-film energy storage device may comprise depositing a first dielectric layer onto the back-side electrode, depositing a lower electrode atop the first dielectric layer, depositing an active energy storage layer atop the lower electrode, which has been described above already, and depositing an upper electrode atop the active energy storage layer, so as to form the thin-film energy storage device.

The method may—in one embodiment—also comprise depositing a second dielectric layer atop of the upper electrode, depositing and structuring a first metal layer atop the second dielectric layer, and forming at least one out of the group comprising an inductance, a capacitor, and a metal gate of the at least one thin-film transistor.

Furthermore, the method may comprise depositing and structuring a third dielectric layer atop the structured first metal layer and the second dielectric layer in areas that the structured first metal layer does not cover. A more of less homogeneous surface may be built. Moreover, the method may comprise depositing and structuring a semiconductor layer atop the third dielectric layer over the metal gate of the at least one thin-film transistor, forming vias from the top of the third dielectric layer to the front-side electrode of the thin-film solar cell and to the back-side electrode of the thin-film solar cell (104), and depositing and structuring a second metal layer on top of the just built superstrate configuration building source and drain of the at least one thin-film transistor. This may establish electrical contact to the front-side electrode of the thin-film solar cell, and to the back-side electrode of the solar cell, through vias.

The above-described method may further be enhanced by building vias from the top of the third dielectric layer to the lower electrode of the thin-film energy storage device and the upper electrode of the thin-film energy storage device. The depositing and structuring of a second metal layer may comprise establishing electrical contact between components of the electronic controller and the lower electrode of the thin-film energy storage device and the upper electrode of the thin-film energy storage device. Thus, the lower functional unit of the solar module may be connectable to the electronic controller layer.

Finally, the integrated thin-film device may be sealed by a cover layer comprising a coating with a known dielectric coating material.

It should also be noted that embodiments of the invention have been described with reference to different subject-matters. In particular, some embodiments have been described with reference to method type claims whereas other embodiments have been described with reference to apparatus type claims. However, a person skilled in the art will gather from the above and the following description that, unless otherwise notified, in addition to any combination of features belonging to one type of the subject-matter, also any combination between features relating to different subject-matters, in particular, between features of the method type claims, and features of the apparatus type claims, is considered as to be disclosed within this document.

The aspects defined above and further aspects of the present invention are apparent from the examples of embodiments to be described hereinafter and are explained with reference to the examples of embodiments, but to which the invention is not limited.

In the following, a detailed description of the Figures will be given. All instructions in the Figures are schematic. First, an embodiment of the inventive thin-film integrated device with a solar cell, an integrated battery, and a controller is described in general terms. Afterwards, further details and embodiments, as well as the method for manufacturing an integrated device with a solar cell, an integrated battery, and a controller, will be described.

A metal oxide material known from use in thin-film transistor (TFT) manufacturing, amorphous InGaZnO (a-IGZO), may be used to replace the amorphous or a-Si based technology as transistor dimensions get further reduced for better integration and lower energy consumption. A-IGZO material may be used in a metal oxide semiconductor field-effect transistor (MOSFET) with about 40× higher electron mobility compared to a-Si. Embodiments of the present invention may combine manufacturing materials and processes from thin-film solar cells, thin-film batteries and thin-film transistors to build new solar cell modules integrated monolithically with power conversion electronics and energy storage devices. Certain embodiments also use a-IGZO to create TFT devices that are compatible with thin-film solar cell manufacturing methods.

Embodiments of the invention may take a variety of forms, and exemplary implementation details are discussed subsequently with reference to the Figures. The method steps described below do not form a complete process flow for manufacturing thin-film solar cells or modules. Since present embodiments may be practiced in conjunction with the thin-film solar cell module fabrication techniques, thin-film energy storage device fabrication techniques, and thin-film transistor fabrication techniques currently used in the art, only a limited number of commonly practiced process steps are included, as necessary, for an understanding of the described embodiments. The Figures represent cross-section portions of a thin-film solar cell during fabrication and are not drawn to scale. Instead the Figures are drawn to illustrate the features of the described embodiments. Specific structural and functional details disclosed herein are not to be interpreted as limiting, but merely as a representative basis for teaching one skilled in the art to variously employ the methods and structures of the present disclosure.

FIG. 1A shows an embodiment of a thin-film solar module 100, according to the disclosed concept. This thin-film solar module 100 comprises a number of sub modules, such as a thin-film solar cell 104, a thin-film energy storage device 106 or thin-film battery, and an electronic controller 108. Such a thin-film electronic controller 108 may comprise a series of active and passive electronic components such as transistors 110, or more complex electronic circuits like microcontrollers comprising MPPT circuits.

The thin-film solar cell 104 may be located on a transparent substrate 102. Passive and active electronic components of the thin-film solar module 100 may be interconnected electrically, either directly by a metal layer 146, or through vias, e.g., vias 148-0, . . . , 148-5 which may be located at different positions within the thin-film solar module 100. For example, via 148-0 and via 148-2 may connect the layers 120 and 124 of the solar cell 104 to the second metal layer 146.

In an alternative configuration of the vias 148, the energy storage device 106 may be connected to the second metal layer 146. In this case, the energy storage device 106, in particular the layers 130 and 134 of the energy storage device 106, may be connected to the second metal layer 146. The vias 148-4 and 148-5, shown in FIG. 1B, may connect the energy storage device 106 to the electronic controller 108. In both cases (FIG. 1A and 1B), vias 148-1 and 148-3 contact the inductor 702 (shown in FIG. 7) to the second metal layer 146 and become a component of the electronic controller 108.

Figure 1B:
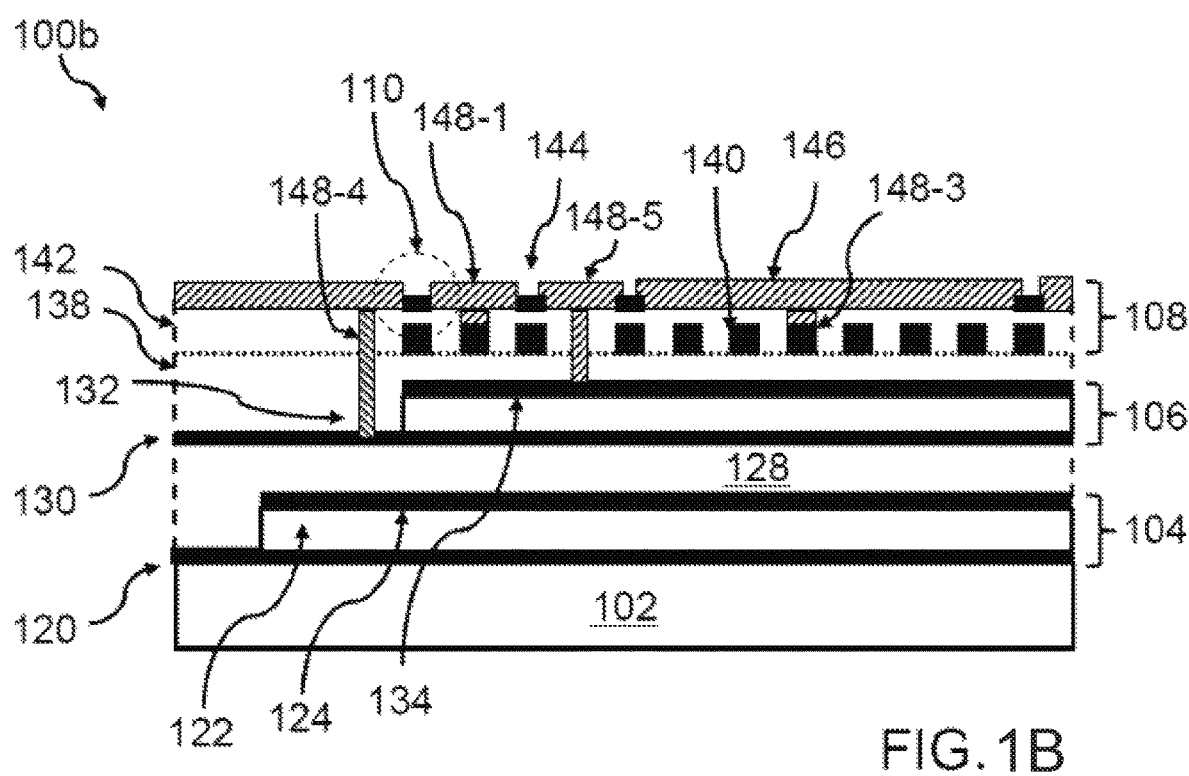
FIG. 1B depicts a thin-film solar module with different vias in accordance with an embodiment of the present invention.

From the concept discussed with respect to FIG. 1A and 1B, a skilled person may understand that two electronic controllers 108 may be configured within the electronic controller layer 108. The different functions may be achieved by different vias.

Thus, the thin-film solar module may comprise—beside intermediate layers, like the first dielectric layer 128 or the second dielectric layer 138—three active compound layers: the thin-film solar cell 104, the thin-film energy storage device 106, and an electronic circuitry in form of an electronic controller 108. It may be noted that all three active compound layers may be manufactured by one integrated thin-film manufacturing process. None of the three active compound layers may be prefabricated or delivered independently to produce the thin-film solar module. Instead, all the required layers as shown in FIG. 1A and 1B, alongside with intermediate layers, are fabricated in one thin-film fabrication process.

Figure 9:
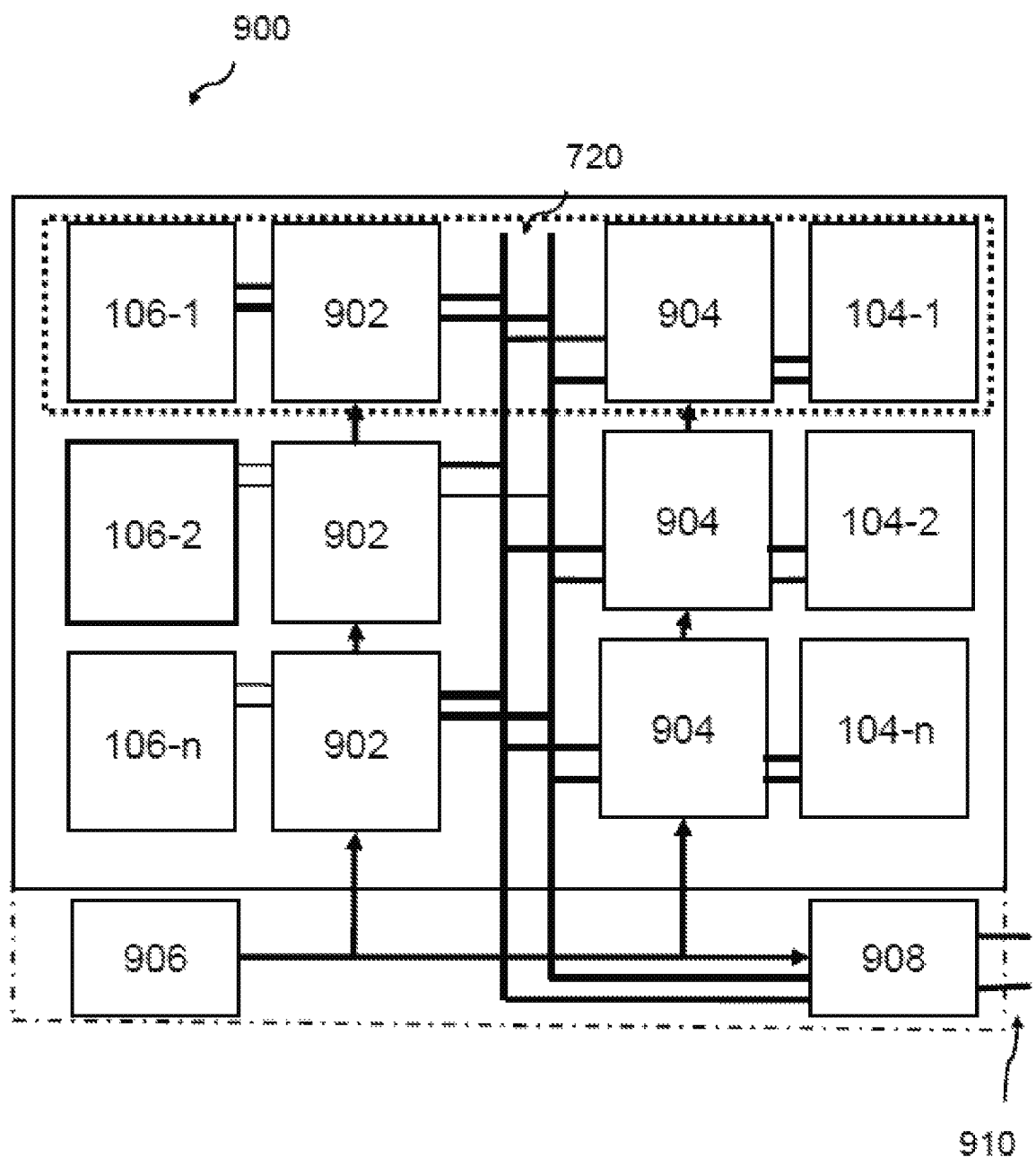
FIG. 9 depicts an extended solar module comprising a series of solar cell modules and electronic controllers in accordance with an embodiment of the present invention.

A group of thin-film solar modules 100 may be linked together electrically to form a larger, more powerful solar module (see, e.g., FIG. 9).

Potential steps for an exemplary embodiment of a method for manufacturing the thin-film solar module 100 including at least one transistor 110, passive electronic components like an inductor and/or a capacitor, as well as a thin-film solar cell on a substrate 102, may now be described using the following schematic illustrations. Although FIGS. 1A, 1B show more than one transistor, only one has been encircled to demonstrate the concept.

Figure 2:
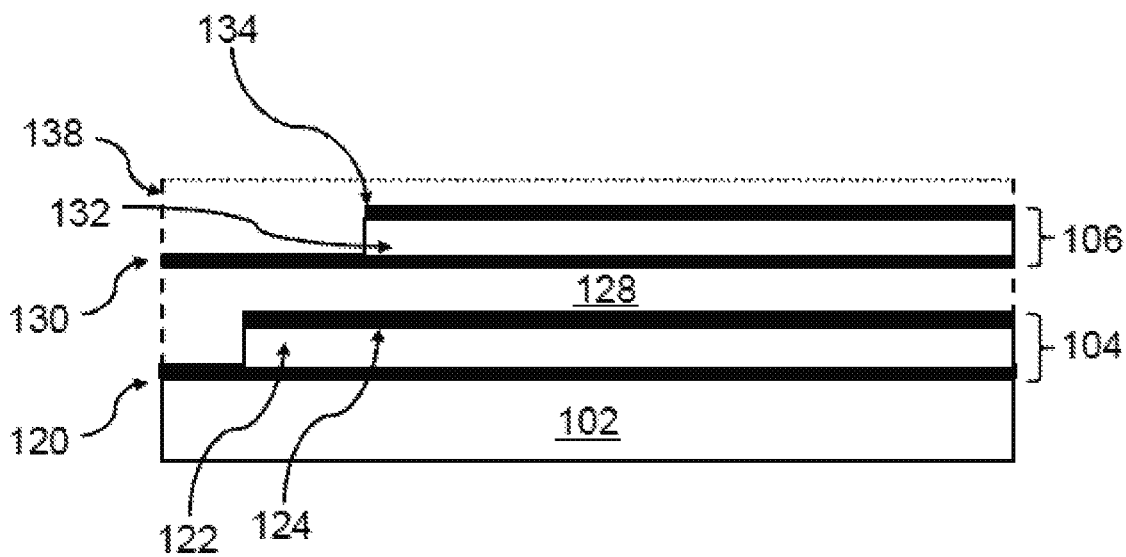
FIG. 2 depicts the thin-film solar cell and the thin-film battery in accordance with an embodiment of the present invention.

FIG. 2 shows a substrate 102 upon which an embodiment of the present invention may be fabricated. The substrate 102 may comprise a non-conducting, transparent carrier element like soda-lime glass or a polyimide film having a thickness of 1 to 3 mm In another embodiment, substrate 102 may be a flexible sheet of steel foil. A front-side electrode 120 may be deposited on the substrate 102. The front-side electrode 120 may comprise metal or a transparent conductive oxide (TCO). TCO materials may comprise, e.g., a zinc oxide (ZnO), tin oxide ($SnO_2$), tin doped indium oxide (ITO) or, indium oxide ($In_2O_3$). Metal materials for the electrode may comprise, e.g., Mo, Cu, Al, Ag or other suitable metals or alloys.

On top of the transparent front-side electrode 120, a photovoltaic layer 122 may be deposited. Atop the photovoltaic layer 122, a backside electrode 124 may be deposited. It may be a metallic conductive layer which also serves as a reflector to reflect most common absorbed light back into the photovoltaic layer 122 of the thin-film solar cell 104. It may be noted that the light may enter the thin-film solar cell 104 via the transparent substrate 102 and the transparent front-side electrode 120. It may also be noted that the front-side electrode 120 of the thin-film solar cell 104 may be longer than the back-side electrode 124 of the thin-film solar cell 104. This may allow an easy connection to layers above the thin-film energy storage device 106 through vias 148. The photovoltaic layer 122 may be the active layer of the solar cell.

The thin-film solar cell 104 may be covered by a deposited first dielectric layer 128. This may be any isolating material like, e.g., $Al_2O_3$ or $SiO_2$, or comparable dielectric material.

Atop the first dielectric layer 128, a lower electrode 130 of the energy storage device 106 may be deposited. Any known deposition technique for thin-film devices may be used. The lower electrode 130 may be a metal or a conductive metal oxide, as mentioned above.

As next layer, an active energy storage layer 132 may be deposited on the lower electrode 130. A second electrode for the thin-film energy storage device 106, an upper electrode 134, may be deposited atop the active energy storage layer 132. The lower electrode 130 and the upper electrode 134 may function as thin-film battery anode and thin-film battery cathode or vice versa. It may be noted that for structuring the different layers, known masking techniques using photo-resist and suitable etching processes may be used.

It may also be noted that the thin-film energy storage device 106 may be manufactured based on, e.g., a Lithium-metal cathodes and solid electrolytes with their beneficial properties in terms of miniaturization, as known by a skilled person. Thin-film lithium batteries offer high power density. As demonstrated here, thin-film batteries offer the potential for integration with other thin-film functional elements. The advantages of positioning the thin-film battery 106 between the other functional layouts, i.e., the thin-film solar cell 104 and electronic components of electronic controller 108 manufactured in the thin-film process have been described above already.

The resulting thin-film energy storage device 106 may be covered with a second dielectric layer 138, thereby integrating the thin-film storage device. Again, the second dielectric layer 138 may comprise any isolating material like, e.g., $Al_2O_3$ or $SiO_2$.

Figure 3:
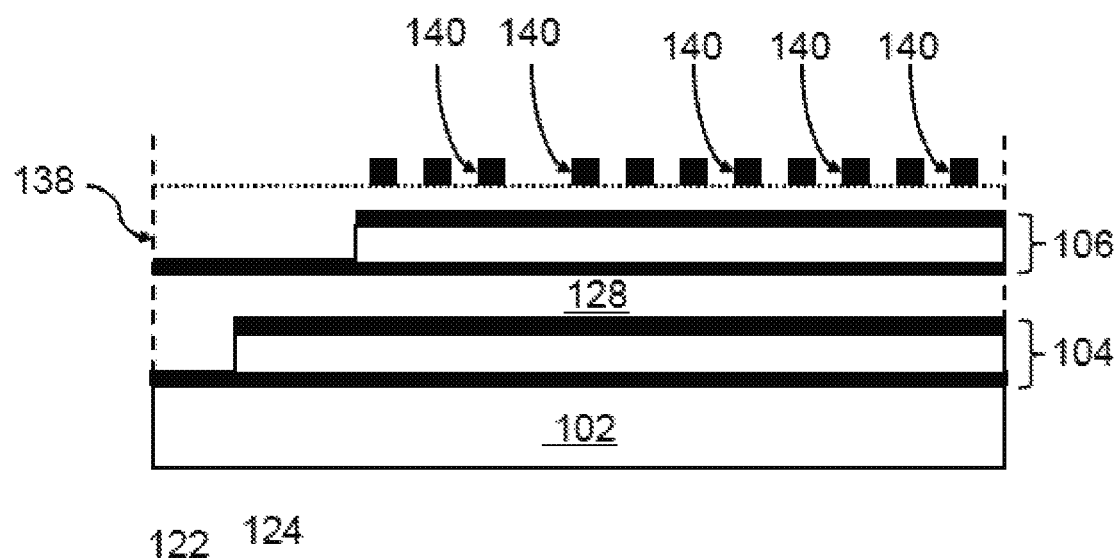
FIG. 3 depicts additional layers of the solar cell module, in particular a second dielectric layer and a first structured metal layer in accordance with an embodiment of the present invention.

Referring to FIG. 3, a first metal layer 140 may be deposited and structured on the second dielectric layer 138. It may be noted that although the thin-film solar cell 104 as well as the thin-film energy storage device 106 have metal layers, i.e., 120, 124, 130, 134, the numbering for the subsequent metal layers may only refer to the third functional device, the electronic controller 108. The depositing and especially the structuring of the first metal layer may again be performed using well known semiconductor fabrication processes using photo-resists masks and material removal processes, e.g., etching.

The structures of the first metal layer 140 atop the second dielectric layer 138 may cover an area above the upper electrode 134 of the thin-film energy storage device 106. However the structures of the first metal layer 140 may extend beyond the limits of the thin-film energy storage device 106. In order to manufacture a compact thin-film solar module, it may be advantageous to limit the structures of the first metal layer to the dimension of the underlying functional devices, i.e., the thin-film solar cell 104 and the thin-film battery 106.

The structures 140 of the first metal layer 140 may—in combination with additional layers—be elements like an inductor (see below), a gate of a transistor, or components of other electric or electronic devices. Several such components may be structured in this metal layer, building an independent electronic controller afterwards.

Figure 4:
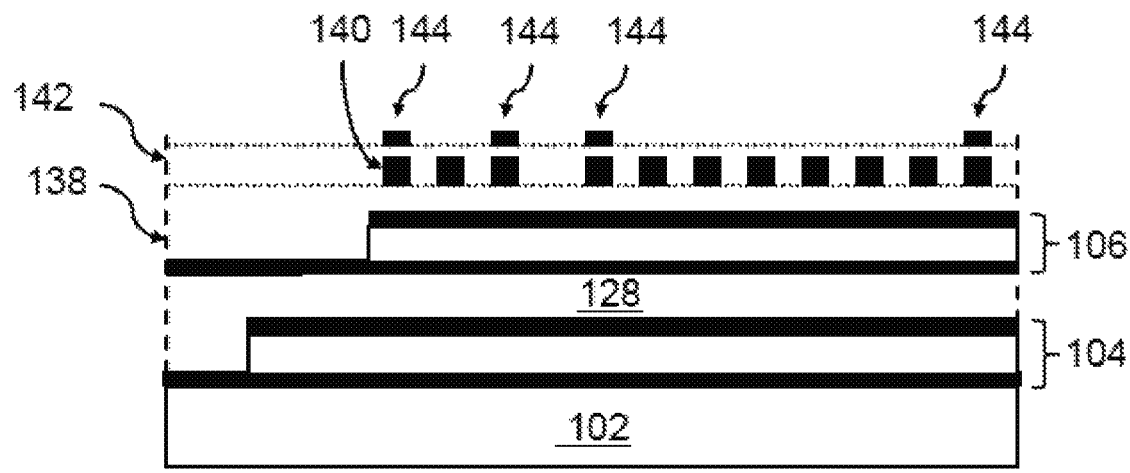
FIG. 4 depicts a third dielectric layer and a structured semiconductor layer in accordance with an embodiment of the present invention.

The structures of the first metal layer 140 may be covered with a third dielectric layer 142, as described in FIG. 4. The third dielectric layer 142 may cover the structures of the first metal layer 140 and may also fill the space between the structures 140 of the first metal layer 140. It may be noted that the second and third dielectric layer may be shown as separated by a dashed line. However, the two dielectric layers may not have a real interface because they may be composed of the same dielectric material.

As the next fabrication step, semiconductor material 144 may be structurally deposited atop the third dielectric layer 142. Again, known masking and structuring techniques may be used. Some of the semiconductor material structures 144 may be positioned above one or more structures 140 of the second metal layer which may later-on partially function as a gate of a MOSFET 110. In such a configuration, the semiconductor structures 144 may function as a channel or active layer of the related MOSFET 110. A semiconductor material 144, in particular, amorphous InGaZnO (a-IGZO) or crystalline IGZO, may be used.

Figure 5:
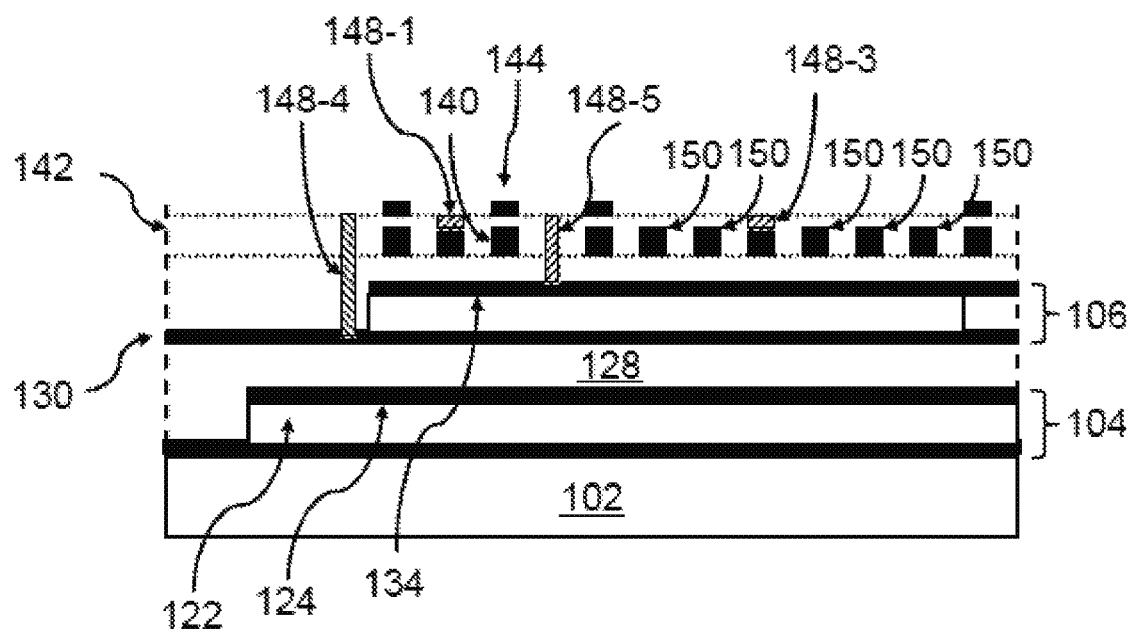
FIG. 5 depicts examples of vias within the superstrate device in accordance with an embodiment of the present invention.
Figure 6:
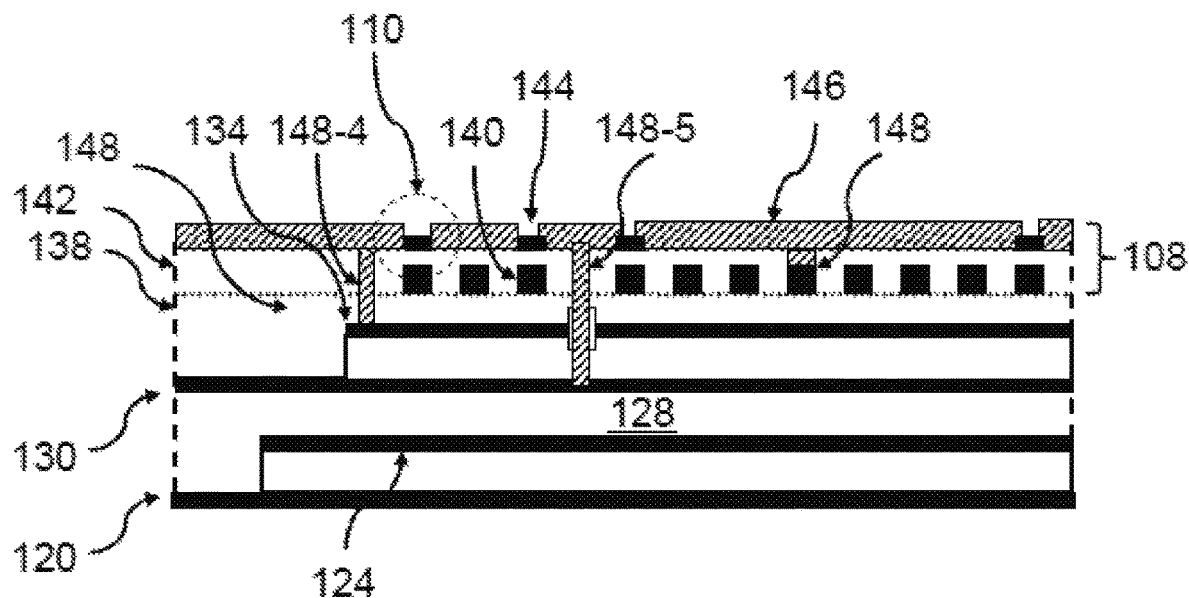
FIG. 6 depicts a second metal layer connecting individual devices of the integrated solar cell module in accordance with an embodiment of the present invention.

In order to establish electrical contact to lower layers of the thin-film solar module, vias 148 may be built into the three-dimensional, superstrate structure of the thin-film solar module 100, as depicted in FIG. 5. Examples of other vias 148 and their connections are shown in FIG. 6. The vias 148-4, 148-5 may build connections from the top of the three-dimensional thin-film device as manufactured so far to lower conducting layers, like, e.g., the lower electrode 130 and the upper electrode 134 of the energy storage device 106.

Vias 148-0, 148-2 may build connections from the top of the three-dimensional thin-film device as manufactured so far to the front-side electrode 120 and the back-side electrode 124 of the solar cell 104, as well as to individual structures 140 of the first metal layer 140. The vias 148-x may selectively be built with isolating sidewalls where appropriate. This is, e.g., shown for the second via 148-5 in FIG. 5 reaching from the surface of the third dielectric layer 142 through the upper electrode 134 of the thin-film energy storage device 106 to the lower electrode 130 of the same functional device 106, the energy storage device 106.

Figure 7:
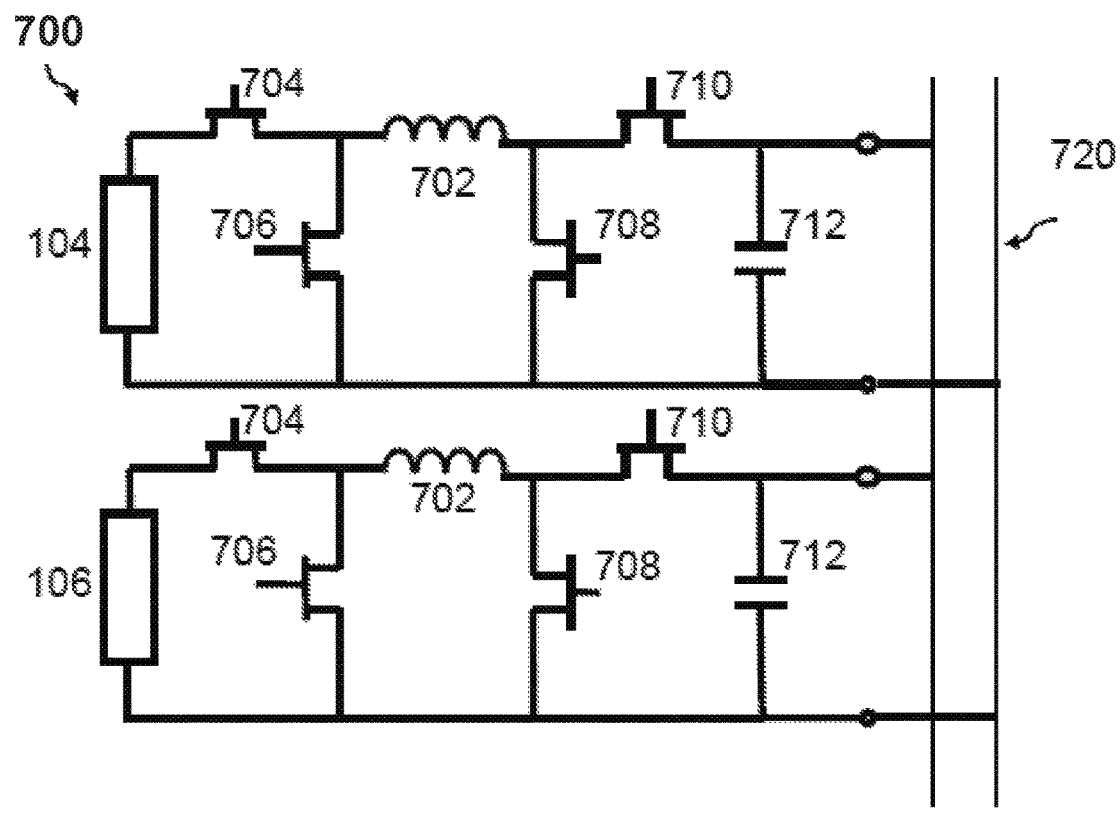
FIG. 7 depicts electronic circuitry functioning as electronic controller in accordance with an embodiment of the present invention.
Figure 8:
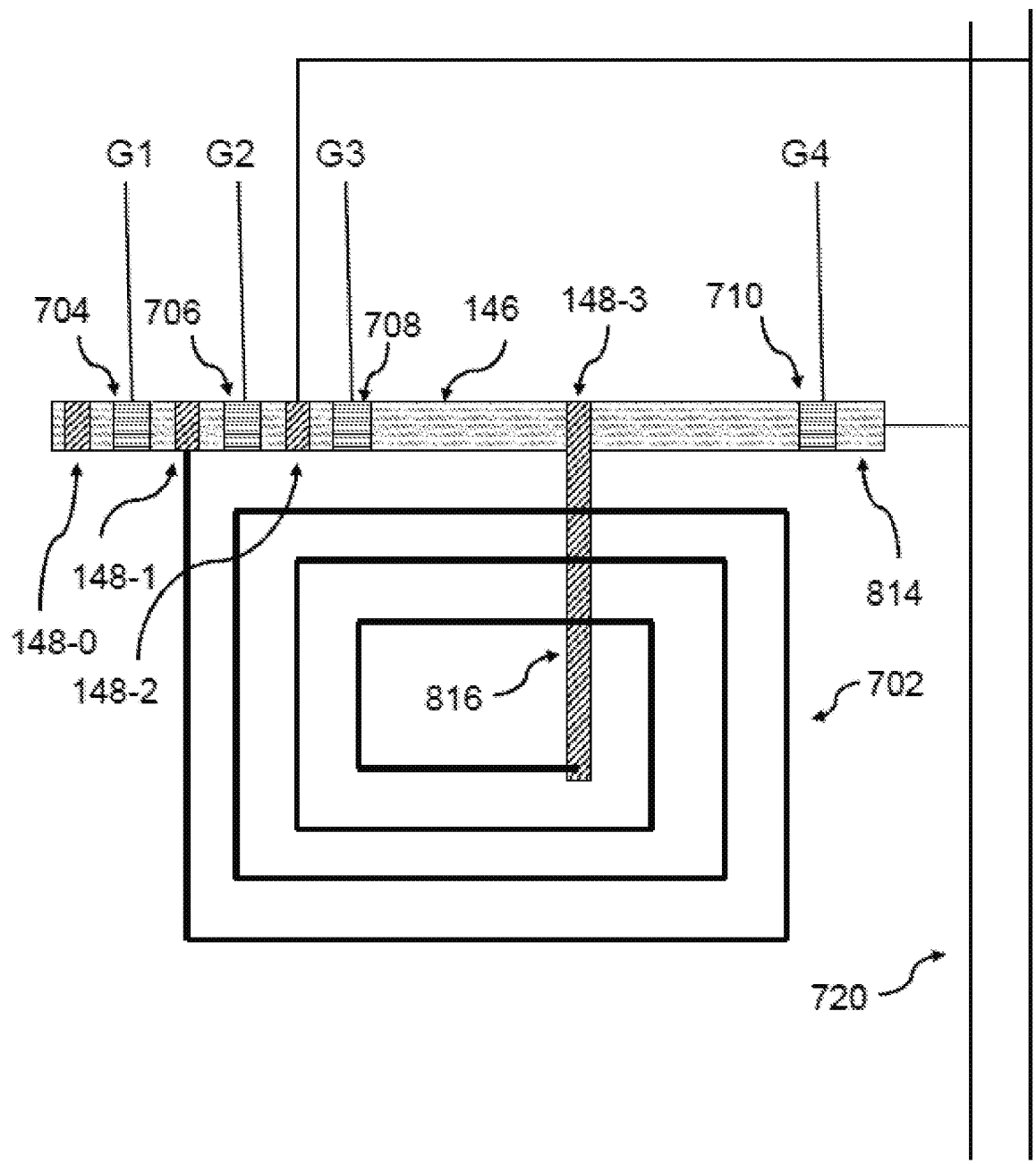
FIG. 8 depicts a top view of the second metal layer, including a connected inductor, in accordance with an embodiment of the present invention.

The via 148-3 may, e.g., be a middle connector of a coil or inductor built of loops or turns in the structured first metal layer (cf. FIG. 8). The structures 150 may depict a cross-section of turns of such an inductor 702 (shown in FIG. 7). Such an inductor may be an example of a passive electric element as part of the electronic controller 108. Also, capacitor plates may be integrated in between the second and the third dielectric layer. A second plate for a capacitor may be included in the second metal layer 146.

Referring now to FIG. 6, in addition, a second metal layer 146 is shown. FIG. 6 depicts an upper portion of the thin-film solar module 100. The second metal layer 146 may be structured, as exemplarily shown. Again, known depositing and structuring techniques may be used for the covering second metal layer 146. As shown, the second metal layer 146 connects to the vias 148-4 and 148-5, and may connect to side portions of the structures 144 of the semiconductor layer 144. If, e.g., elements of the second metal layer 146 may connect electrically and mechanically to sides of the semiconductor structure 144, the semiconductor structure 144 may build a channel of a transistor, e.g., transistor 110, in which structures 140 of the first metal layer 140 function as a gate of such a transistor 110. This way, a third functional unit, namely, elements of the electronic controller 108 may be built as part of the integrated thin-film solar module.

Additional semiconductor components, i.e., active electronic devices as well as passive electrical components, may be monolithically integrated in the electronic controller 108. Also these elements may advantageously be built as part of the thin-film manufacturing process. The electronic controller may, e.g., include MPPT components and/or DC-DC or DC-AC converters. Different functional modes of the controller have already been discussed above.

Another layer may cover the complete superstrate configuration of the thin-film solar module protecting it from outside environmental influences. Materials for a sealing layer are known to a skilled person.

It may be noted that the thin-film battery 106 may be a stack of thin-film batteries. It may also be noted that not just one thin-film solar cell 104 may be connected to electronic controller 108. Instead, a series of thin-film solar cells 104 may be connectable to the electronic controller 108 and/or the battery 106. This way, any combination of numbers of thin-film solar cells 104 and thin-film batteries 106 may be combined with any suitable kind of electronic components as part of the electronic controller 108.

FIG. 7 illustrates control circuitry 700 to shape an output waveform of the solar cell 104, in accordance with an embodiment of the present invention. The control circuitry may be realized by the electronic controller 108. Circuit 700 shows an electrical circuit diagram as part of the device 100 of FIG. 1A or 1B comprising wiring, the solar cell 104 or alternatively, the energy storage device 106, four transistors 704, 706, 708, and 710, an inductor 702, and a capacitor 712. The transistors 704, 706, 708, and 710 may act as switches to change the circuit connection of the solar cell 104 or the energy storage device 106 selectively to the DC bus 720. The circuitry 700 may also be used to transform the output voltage of either the solar cell 104 or alternatively, the energy storage device 106 to a level appropriate to the DC bus 720. It may be noted that the connection of either the solar cell 104 or alternatively the energy storage device 106 to the control circuitry 700 may depend on the vias, as discussed above.

FIG. 8 shows a symbolic view onto the second metal layer 146. Also illustrated are connections to transistors 704, 706, 708 and 710. Symbolically, lines are drawn to these transistors symbolizing connections to the gates G1, G2, G3, and G4 of these transistors as part of the first metal layer. The via 148-3 is shown as a 2-dimensional equivalent connecting to the middle connector of the Inductor 702. At the other end of the inductor 702, via 148-1 is shown. Also visible are the vias 148-0 and 148-2. From the via 148-2, a ground line is drawn to the DC bus 720. On the other end, the positive output of the shown circuitry delivers a positive voltage at 814, which may also be connected to the DC bus 720.

FIG. 9 shows an extended solar module 900 comprising a series of solar cell modules 100 and electronic controllers. On the left side, a series of energy storage devices 106-1, 106-2, . . . , 106-n are connected to charger/discharger DC/DC circuits 902, which may have the form as discussed in the context of FIG. 7. The energy storage devices 106-1, 106-2, . . . , 106-n are connected via a series of circuits 902 to the DC bus 720.

On the right side of FIG. 9, a series of solar cells 104-1, 104-1, 104-n are connected via DC/DC MPPT circuits 904 to the DC bus 720. The circuits 904 may have the form as discussed in the context of FIG. 7. The function of the circuits 902 as well as the function of the circuits 904 may be controlled by the controller 906. The controller 906 may also be integrated into the electronic controller 108, as discussed in the context of FIGS. 1A and 1B. The controller 906 may also influence a DC/AC converter 908 which may take the signals of the DC bus 720 as input in order to generate an AC output 910. Both, the controller 906 and the DC/AC converter 908 may optionally be part of the electronic controller 108.

Figure 10:
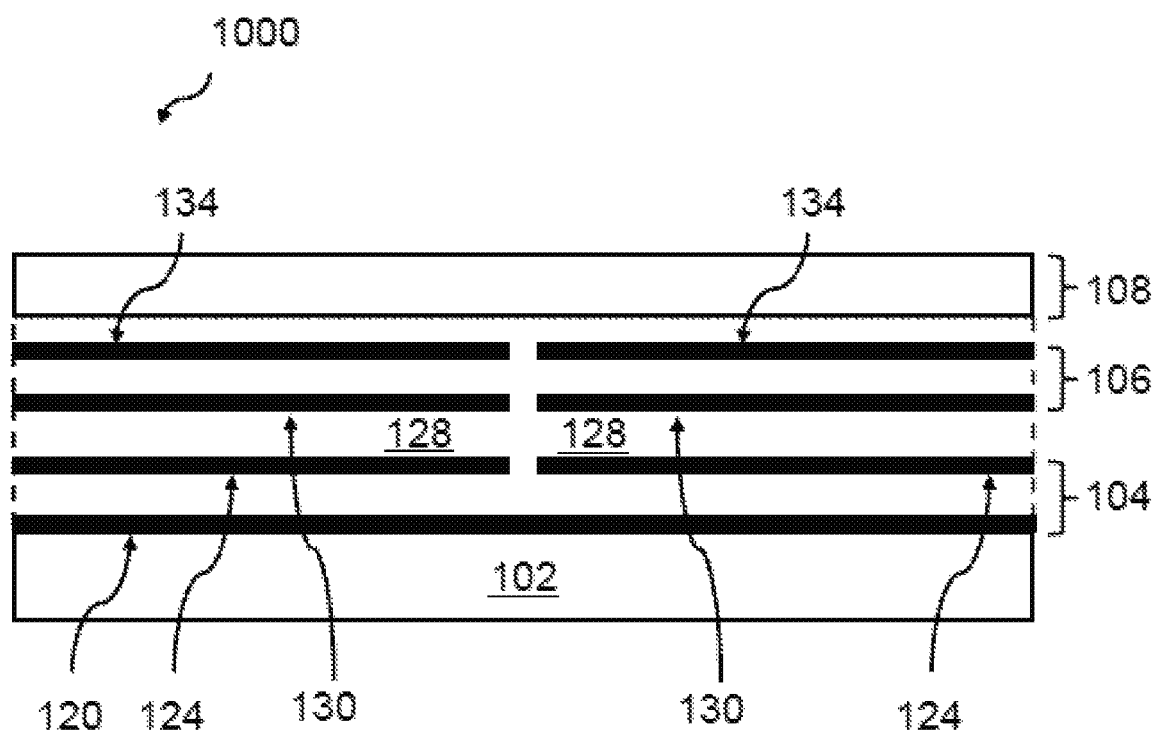
FIG. 10 depicts a configuration of two combined solar cell modules in accordance with an embodiment of the present invention.

FIG. 10 shows a configuration 1000 of two combined solar modules 100. This figure shows the two combined solar modules having each a solar cell layer 104, an energy storage device layer 106 and an electronic controller layout 108. Both solar modules 100 have the transparent front-side electrode 120 in common. The back-side electrodes 124 of the solar cells 104, as well as the lower electrodes 130 and the upper electrodes 134 of the energy storage devices 106 of the two side-by-side configured solar modules 100 are not connected to each other. This way, one of the solar modules 100—e.g., the left one—may have an electronic controller layer 108 with vias 148 according to FIG. 1A, whereas the other solar module 100—e.g., the right one—may have an electronic controller layer with vias according to FIG. 1B.

While the invention has been described with respect to a limited number of embodiments, those skilled in the art, having benefit of this disclosure, will appreciate that other embodiments may be devised, which do not depart from the scope of the invention, as disclosed herein. Accordingly, the scope of the invention should be limited only by the attached claims. Also, elements described in association with different embodiments may be combined.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiment was chosen and described in order to best explain the principles of the invention and the practical application, and to enable others of ordinary skills in the art to understand the invention for various embodiments with various modifications, as are suited to the particular use contemplated.

For purposes of the description herein, the terms "upper", "lower", "right", "left", "vertical", "horizontal", "top", "bottom", and derivatives thereof shall relate to the disclosed structures and methods, as oriented in the drawing Figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element is connected without any intermediary conducting, insulating or semiconductor layers at the interface of the two elements.

The terminology used herein is for the purpose of describing particular embodiments only and is not intended to limit the invention. As used herein, the singular forms "a", "an" and "the" are intended to include the plural forms as well, unless the context clearly indicates otherwise. It may be further understood that the terms "comprises" or "comprising," when used in this specification, specify the presence of stated features, integers, steps, operations, elements, or components, but do not preclude the presence or addition of one or more other features, integers, steps, operations, elements, components, or groups thereof.

The descriptions of the various embodiments of the present invention have been presented for purposes of illustration, but are not intended to be exhaustive or limited to the embodiments disclosed. Many modifications and variations may be apparent to those of ordinary skills in the art without departing from the scope and spirit of the described embodiments. Thus, the present invention is not limited to the embodiments shown, but is to be accorded the widest scope consistent with the principles and features disclosed herein.

What is claimed is:

1. A method for manufacturing a thin-film solar module in a superstrate configuration, the method comprising:
   fabricating a thin-film solar cell, having at least one solar diode on a transparent substrate at a first temperature;
   fabricating a thin-film energy storage device after the thin-film solar cell at a second temperature;
   fabricating an electronic controller, comprising at least one thin-film transistor, above the thin-film energy storage device; fabricating an oxide semiconductor at room temperature on top of the thin-film energy storage device after the fabricating of the thin-film energy storage device: and
   providing electrical connections between the electronic controller and the thin-film solar cell by a first set of vias, wherein the electronic controller is electrically connected to the thin-film energy storage device by a second set of vias, wherein the first set of vias extends through at least the thin-film energy storage device.

2. The method according to claim 1, wherein fabricating the thin-film solar cell comprises:
   depositing a transparent front-side electrode atop the transparent substrate;
   depositing a photovoltaic layer atop the front-side electrode; and
   depositing a back-side electrode onto the photovoltaic layer so as to form the thin-film solar cell.

3. The method according to claim 2, wherein fabricating the thin-film energy storage device comprises:
   depositing a first dielectric layer onto the back-side electrode;
   depositing a lower electrode atop the first dielectric layer;
   depositing an active energy storage layer atop the lower electrode; and
   depositing an upper electrode atop the active energy storage layer so as to form the thin-film energy storage device.

4. The method according to claim 3, wherein fabricating the electronic controller comprises:
   depositing a second dielectric layer atop of the upper electrode;
   depositing and structuring a structured first metal layer atop the second dielectric layer, forming at least one out of the group comprising an inductor, a capacitor, and a metal gate of the at least one thin-film transistor;
   depositing and structuring a third dielectric layer atop the structured first metal layer and the second dielectric layer in areas the structured first metal layer does not cover;
   depositing and structuring a semiconductor layer atop the third dielectric layer and positioned over the metal gate of the at least one thin-film transistor;
   building the first set of vias from the top of the third dielectric layer to the front-side electrode of the thin-film solar cell and to the back-side electrode of the thin-film solar cell; and
   depositing and structuring a second metal layer atop the third dielectric layer, forming a source and drain of the at least one thin-film transistor and establishing contact to the front-side electrode of the thin-film solar cell and to the back-side electrode of the thin-film solar cell through the first set of vias.

5. The method according to claim 4, further comprising building the second set of vias from the top of the third dielectric layer to the lower electrode of the thin-film energy storage device and to the upper electrode of the thin-film energy storage device, wherein depositing and structuring the second metal layer comprises establishing electrical contact between components of the electronic controller, the lower electrode of the thin-film energy storage device, and the upper electrode of the thin-film energy storage device.

6. The method according to claim 4, further comprising:
   forming the inductor within the first metal layer; and
   forming a third set of vias through the third dielectric layer by etching the third dielectric layer;
   wherein the third dielectric layer is etched selectively to enable a connection of the inductor to the second metal layer.

7. The method according to claim 1, wherein the first temperature is higher than the second temperature.

* * * * *